(12) United States Patent
Lu

(10) Patent No.: US 10,101,373 B2
(45) Date of Patent: Oct. 16, 2018

(54) CAPACITIVE IMAGING DEVICE WITH ACTIVE PIXELS AND METHOD

(71) Applicant: Palo Alto Research Center Incorporated, Palo Alto, CA (US)

(72) Inventor: JengPing Lu, Fremont, CA (US)

(73) Assignee: Palo Alto Research Center Incorporated, Palo Alto ( * ) Notice: Subject to any disclaimer, the term of this patent is extended or adjusted under 35 U.S.C. 154(b) by 447 days.

(21) Appl. No.: 14/257,566

(22) Filed: Apr. 21, 2014

(65) Prior Publication Data

US 2015/0300799 A1 Oct. 22, 2015

(51) Int. Cl.
*G01R 27/26* (2006.01)
*G06F 3/044* (2006.01)
*G06K 9/00* (2006.01)
*G06F 3/041* (2006.01)

(52) U.S. Cl.
CPC ......... *G01R 27/2605* (2013.01); *G06F 3/044* (2013.01); *G06F 3/0416* (2013.01); *G06K 9/0002* (2013.01)

(58) Field of Classification Search
CPC ........ G01D 5/24; G01D 5/241; G01D 5/2412; G01D 5/2417; G06K 9/0002; G01R 27/26; G01R 27/2605
USPC ....... 324/519, 548, 658, 661, 662, 663, 669, 324/671, 684, 686, 76.79, 76.81, 123 R, 324/123 C
See application file for complete search history.

(56) References Cited

U.S. PATENT DOCUMENTS

| | | | |
|---|---|---|---|
| 4,112,365 A | 9/1978 | Larson et al. | |
| 4,254,345 A * | 3/1981 | Ullrich | G11C 19/186 257/251 |
| 4,323,846 A * | 4/1982 | Haraszti | G05F 3/245 323/311 |
| 4,359,756 A | 11/1982 | Schneider et al. | |
| 5,083,016 A | 1/1992 | Wyles et al. | |
| 5,325,442 A | 6/1994 | Knapp | |
| 5,940,526 A | 8/1999 | Setlak et al. | |
| 6,191,593 B1 | 2/2001 | Tartagni et al. | |

(Continued)

FOREIGN PATENT DOCUMENTS

| | | |
|---|---|---|
| CN | 102017147 | 4/2011 |
| GB | 2475055 | 5/2011 |
| JP | 2010517250 | 5/2010 |

OTHER PUBLICATIONS

File History for U.S. Appl. No. 14/257,571.
(Continued)

*Primary Examiner* — Giovanni Astacio-Oquendo
(74) *Attorney, Agent, or Firm* — Hollingsworth Davis, LLC

(57) ABSTRACT

A capacitive image sensor includes a sensor array having capacitive image pixels. Each pixel has a two-transistor configuration including a pixel selection transistor and a source follower transistor. The pixel selection transistor activates the source follower transistor. The source follower is coupled to a variable capacitance that affects an input impedance of the source follower. An AC current is source is used to interrogate the activated source follower to determine an output impedance of the source follower. The output impedance is a function of the input impedance and the output impedance is representative of the nearness of an object.

20 Claims, 7 Drawing Sheets

(56) References Cited

U.S. PATENT DOCUMENTS

| | | | |
|---|---|---|---|
| 6,201,270 B1* | 3/2001 | Chen | H01L 27/14609 250/214.1 |
| 6,246,043 B1 | 6/2001 | Merrill | |
| 6,410,899 B1 | 6/2002 | Merrill | |
| 6,437,341 B1 | 8/2002 | Izumi et al. | |
| 6,681,033 B1 | 1/2004 | Yano et al. | |
| 6,974,971 B2 | 12/2005 | Young | |
| 7,006,078 B2 | 2/2006 | Kim | |
| 7,280,167 B2* | 10/2007 | Choi | G06F 3/0412 345/174 |
| 7,616,786 B2 | 11/2009 | Setlak | |
| 7,755,369 B2 | 7/2010 | Chuang et al. | |
| 8,441,459 B2 | 5/2013 | Chen et al. | |
| 8,447,077 B2* | 5/2013 | Benkley | G06T 7/204 345/156 |
| 8,519,320 B2 | 8/2013 | Miyazawa et al. | |
| 8,618,865 B1 | 12/2013 | Lu | |
| 8,888,004 B2* | 11/2014 | Setlak | G06K 9/605 235/439 |
| 8,970,537 B1* | 3/2015 | Shepelev | G06F 3/044 178/18.01 |
| 9,035,906 B2* | 5/2015 | Elia | G06F 3/044 345/174 |
| 9,081,453 B2* | 7/2015 | Bulea | G06F 3/044 |
| 9,081,457 B2* | 7/2015 | Solven | G06F 3/044 |
| 9,160,331 B2* | 10/2015 | Bakken | G06F 3/044 |
| 9,176,597 B2* | 11/2015 | Soo | G06F 3/03 |
| 9,214,911 B2* | 12/2015 | Kropfitsch | H03G 1/0094 |
| 2003/0151572 A1* | 8/2003 | Kumada | G09G 3/3614 345/87 |
| 2004/0000632 A1* | 1/2004 | Apte | H04N 3/155 250/208.1 |
| 2004/0155973 A1 | 8/2004 | Bea et al. | |
| 2004/0251917 A1* | 12/2004 | Blanchard | G01D 5/2405 324/661 |
| 2005/0079386 A1* | 4/2005 | Brown, Jr. | B82Y 10/00 428/690 |
| 2005/0094855 A1 | 5/2005 | Proano et al. | |
| 2006/0101281 A1 | 5/2006 | Zhang et al. | |
| 2007/0024546 A1 | 2/2007 | Jang et al. | |
| 2007/0052829 A1 | 3/2007 | Brissot | |
| 2007/0187724 A1 | 8/2007 | Kaufmann et al. | |
| 2007/0216657 A1* | 9/2007 | Konicek | G06F 3/0412 345/173 |
| 2008/0055447 A1* | 3/2008 | Bellingrath | H03F 3/50 348/308 |
| 2008/0062140 A1 | 3/2008 | Hotelling et al. | |
| 2008/0246539 A1* | 10/2008 | Zadeh | H03H 11/48 327/558 |
| 2008/0283885 A1 | 11/2008 | Hynecek | |
| 2008/0283886 A1 | 11/2008 | Hynecek | |
| 2008/0297878 A1* | 12/2008 | Brown | B82Y 10/00 359/263 |
| 2009/0027352 A1 | 1/2009 | Abele | |
| 2009/0166627 A1 | 7/2009 | Han | |
| 2009/0212197 A1 | 8/2009 | Buttgen et al. | |
| 2009/0224343 A1 | 9/2009 | Akram | |
| 2009/0224351 A1 | 9/2009 | Hsieh | |
| 2009/0321613 A1 | 12/2009 | Veeder | |
| 2010/0079178 A1 | 4/2010 | Mheen et al. | |
| 2010/0079406 A1 | 4/2010 | Chen et al. | |
| 2010/0194697 A1* | 8/2010 | Hotelling | G06F 3/0412 345/173 |
| 2010/0292945 A1* | 11/2010 | Reynolds | G06F 3/044 702/65 |
| 2011/0001860 A1* | 1/2011 | Taruki | H04N 5/359 348/300 |
| 2011/0025635 A1* | 2/2011 | Lee | G06F 1/3203 345/173 |
| 2011/0204461 A1* | 8/2011 | Lee | H01L 27/14647 257/432 |
| 2012/0075168 A1 | 3/2012 | Osterhout et al. | |
| 2012/0112047 A1 | 5/2012 | Brown et al. | |
| 2012/0144920 A1 | 6/2012 | Wong et al. | |
| 2012/0206408 A1 | 8/2012 | Brown | |
| 2012/0256077 A1* | 10/2012 | Yen | H01L 27/14609 250/208.1 |
| 2013/0135277 A1* | 5/2013 | Ikeda | G09G 1/005 345/211 |
| 2013/0200907 A1 | 8/2013 | Schneider et al. | |
| 2014/0159746 A1* | 6/2014 | Lu | G06F 3/044 324/658 |
| 2014/0266262 A1* | 9/2014 | Taghibakhsh | G06K 9/0002 324/686 |
| 2015/0030217 A1* | 1/2015 | Wickboldt | G06K 9/00026 382/124 |
| 2017/0060150 A1* | 3/2017 | Stefanski | G05D 23/27 |
| 2018/0036740 A1* | 2/2018 | Nelson | B02C 19/18 |
| 2018/0059176 A1* | 3/2018 | Ding | G01R 31/2891 |

OTHER PUBLICATIONS

U.S. Appl. No. 14/139,129, filed Dec. 23, 2013, Lu.
Hong, "On-chip Spatial Image Processing with CMOS Active Pixel Sensors", 2001, 234 pages.
File History for EP App. No. 13191016.8 as retrieved from the EP Electronic File System on Aug. 5, 2016, 90 pages.
Kanda et al., "Integrated Active Matrix Capacitive Sensors for Touch Panel LTPS-TFT LCDs", International Symposium, Society for Information Display, May 18, 2008, 4 pages.
File History for U.S. Appl. No. 14/139,129.

* cited by examiner

CAPACITIVE IMAGING DEVICE WITH ACTIVE PIXELS AND METHOD

TECHNICAL FIELD

The present disclosure relates to electronic imaging technology and, more particularly, to a capacitive image sensor utilizing capacitive image pixels that have a two-transistor configuration.

BACKGROUND

There are many imaging modalities routinely used today for various types of filmless x-rays and fingerprint sensing. Examples include optical imaging, which is the predominant imaging technique for fingerprints, ultrasonic imaging, and capacitive imaging. For each of the specific imaging techniques there are pros and cons. Optical imaging produces a pattern of light and dark that makes up a visual impression of a fingerprint with components that are easily obtained and inexpensive. However, that visual image produced under optical imaging can be tainted by stray light or surface contamination of the imaging plate. Ultrasonic imaging enables the user to see beneath the skin providing more information as a biometric measure. However, ultrasonic imaging is slow, expensive, bulky, and data intensive. Capacitive imaging is widely used for small size finger print sensors, e.g., line scanners or single finger areas, because of its simple structure. However, for large area finger print scanners, i.e., those having a so-called 4-4-1 format, utilizing capacitive imaging techniques has proven difficult due to unreasonable component costs and difficulties in meeting an optimal signal-to-noise ratio.

SUMMARY

A capacitive image sensor of an example embodiment includes a sensor array having capacitive image pixels. Each pixel has a two-transistor configuration including a pixel selection transistor and a source follower transistor. The pixel selection transistor activates the source follower transistor. The source follower is coupled to a variable capacitance that affects an input impedance of the source follower. An AC current source is used to interrogate the activated source follower to determine an output impedance of the source follower. The output impedance is a function of the input impedance and is representative of the nearness of an object. The combination of all output impedances from all pixels is used to create an image of the object.

The variable capacitance varies in accordance with the nearness of the object which is affective in altering capacitance. The sensor and/or pixel may further include a DC current source that is used to set a working bias point for the pixel circuit. The AC current source provides a known amplitude and frequency, and may provide a sinusoidal signal or a square-wave signal. The sensor and/or pixel may be implemented with thin film technology. The sensor may provide a resolution of up to about 1000 ppi (pixels per inch).

A method to obtain an impedance readout from the capacitive image pixel includes activating the source follower transistor with the pixel selection transistor, interrogating the source follower transistor by applying an AC current source to the source follower transistor, and determining an output impedance of the source follower transistor based on the interrogation. Notably, the output impedance is a function of the input impedance and, as such, is representative of the nearness of an object that is capable of affecting the variable capacitance. The method may additionally include measuring the voltage output of the source follower transistor wherein the voltage output correlates to the output impedance.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure relates to touch/proximity pattern sensors such as fingerprint sensors. Generally, fingerprints (and similar patterns, e.g., on hands and feet) are readily accessible biometric indicators that are unique to each person. As a result, computer scanned hand/fingerprint images can be used for purposes such as authentication. For example, a scanning sensor may include a flat surface against which to place the finger (or any scanned object). In response to the contact, the sensor generates an image of the texture/contours of the scanned object. Pattern recognition software can compare metrics of the scanned image to stored metrics, and confirm identity based on a match of the metrics.

There are a number of ways a fingerprint image can be obtained, such as using optical sensors. Embodiments described below use capacitive sensing. Generally, an object that touches a sensing surface will affect the local electrical capacitance of the surface wherever there is contact. While capacitive touch input sensing is widely used to determine coarse indications of contact location (e.g., touchscreens, touchpads), the sensors described herein may be capable of much higher resolution (e.g., on the order of 1000 dpi) than a conventional touch input sensor. It will be understood that, while the embodiments herein may be described in the context of biometric touch sensing, the embodiments and variations thereof may be applicable to other applications and devices. For example, devices such as non-destructive testing imagers may obtain an image based on portions of an object that touch and/or are in relatively close proximity to a contact sensing element.

Figure 1:
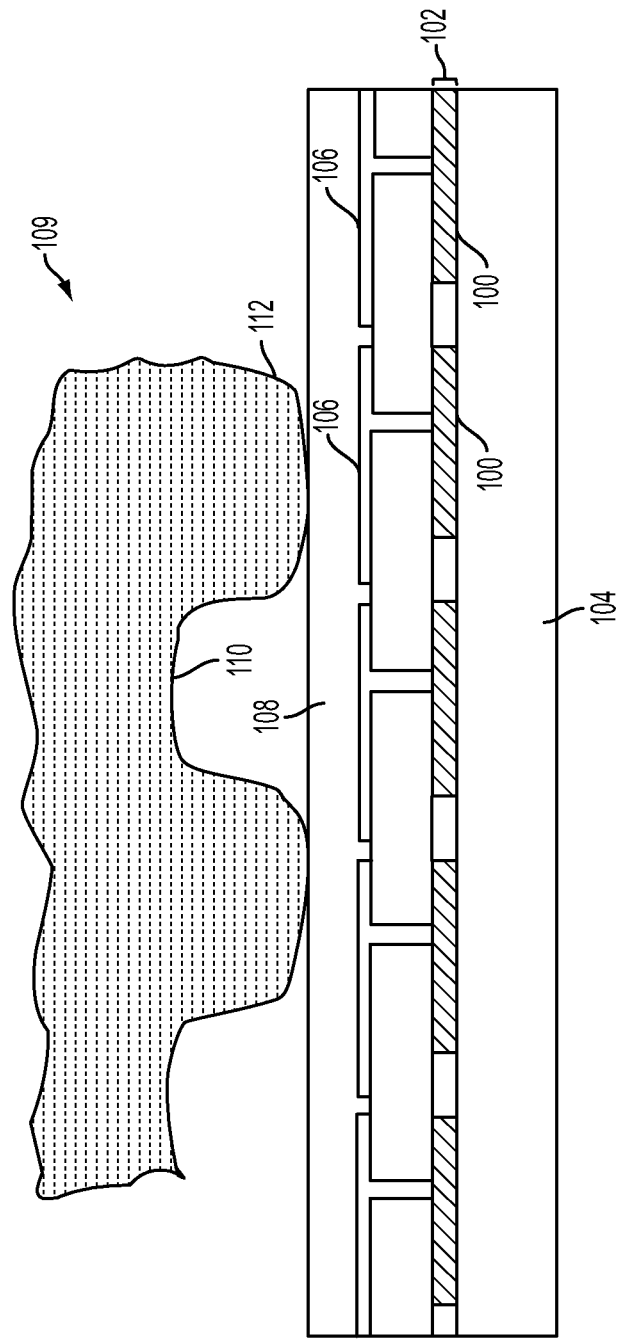
FIG. 1 is a cross-sectional view of a capacitive touch pattern sensor according to an example embodiment.

In reference now to FIG. 1, a cross-sectional view illustrates a capacitive touch pattern sensor according to an example embodiment. A sensor array 102 is built on top of a substrate 104 (e.g., glass). The sensor array 102 includes a plurality of active pixels 100, an example of which will be described further below. Generally, each pixel 100 is electrically coupled to sensing pads 106. The pads 106 are electrically conductive and covered by an insulator layer 108. The insulator layer 108 may be made from a protecting coating polymer such as Parylene. A conductive object 109 contacting the insulating layer 108 changes a local capacitance at the pads 106. For example, a fingerprint ridge 112 that is different than another pad 106 directly below fingerprint valley 110. The capacitance may vary not only based on contact versus non-contact, but may also vary depending on the relative proximity of non-contacting portions. For example, different fingerprint valleys may cause different capacitance due to different distances from a surface of the insulating layer 108.

Figure 2:
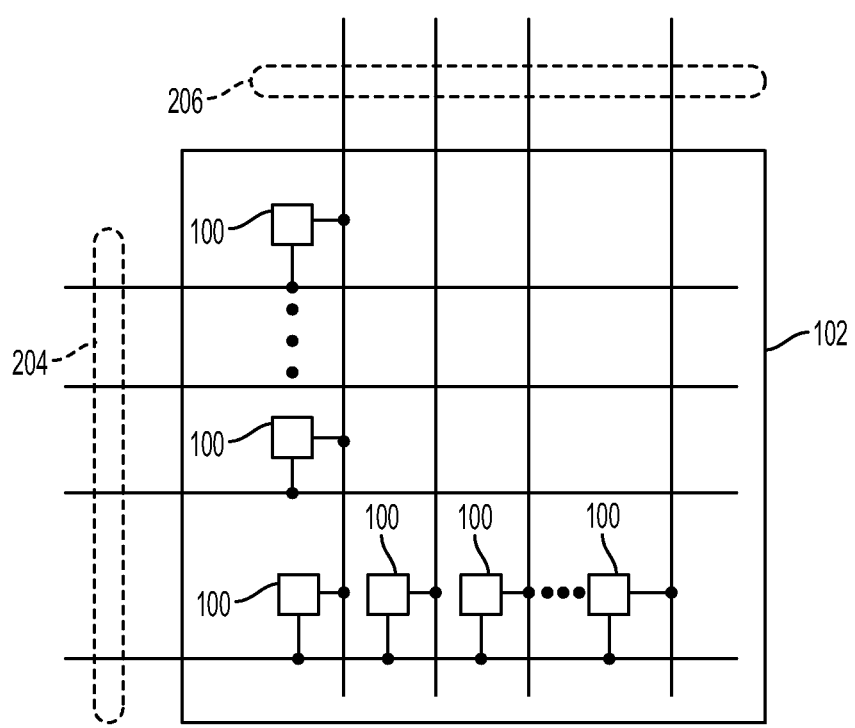
FIG. 2 is a block diagram illustrating details of a sensor array according to an example embodiment.

In reference now to FIG. 2, a block diagram illustrates details of a sensor array 102 according to an example embodiment. The sensor array 102 includes a number of individual active pixel elements 100. Each of these elements 100 are associated with one of a row line 204 and a column line 206. Generally, to detect an image, each of the row lines 204 may be activated in sequence. Activating a row line 204 causes all elements 100 in the rows to become active (e.g., switching on an enabling transistor). Then each of the column lines (e.g., data lines) 206 is scanned to read the individual elements 100 in the currently activated row. Alternate methods of scanning the elements 100 are known in the art, and the embodiments need not be limited to what is shown in FIG. 2.

As will be described in greater detail below, the reading of each column line 206 may involve applying to each column line 206 a first voltage level for a first period of time, then switching to a second, lower voltage level for a second period of time. The first voltage level charges the currently read element 100 and the second voltage level causes a current flow via the column line that indicates a sensed capacitance of the element 100.

Figure 3:
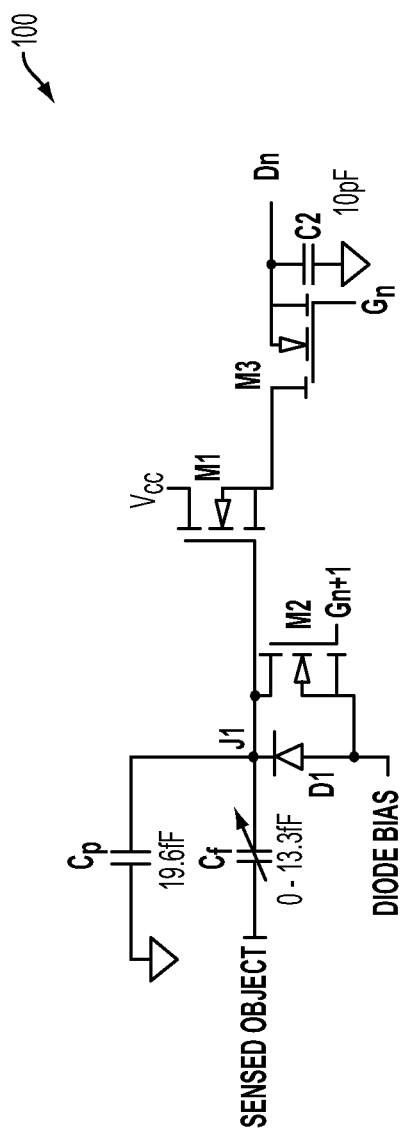
FIG. 3 is a schematic diagram illustrating an active pixel circuit disclosed in an earlier-filed disclosure (PRIOR ART).

In reference now to FIG. 3, a schematic diagram illustrates an active pixel 100 according to a previously disclosed, prior art embodiment which may be found in U.S. Pat. No. 8,618,865. The active pixel 100 is generally configured as a three-transistor sensor, sometimes abbreviated as a 3T sensor pixel. The three transistors M1, M2, M3 in this diagram are n-type, low-temperature, polycrystalline silicon (Poly-si) thin film transistors (TFTs) although it may be possible to use other types of transistor devices such as metal oxide semiconductor, field-effect transistors (MOSFETs). Transistor M2 is configured as a reset transistor in response to reset signal $G_{n+1}$. When $G_{n+1}$ is activated, M2 shorts out high frequency rectifying/detection diode D1, allowing sensing junction J1 to be tied to the biasing voltage of D1. By tying the reset transistor M2 to the enable line of the following row ($G_{n+1}$), the active pixels 100 can be reset without using a separate set of reset lines. In other configurations, M2 may be reset by another line, such as the preceding row enable ($G_{n+1}$), a separate reset line, a data line Dn of an adjacent column, etc.

As seen in FIG. 3, two capacitors, $C_p$ and $C_f$ are coupled to the detection diode D1 at sensing junction J1. The $C_p$ component is a parasitic capacitor, having one end coupled to the sensing junction J1 and the other end at ground. The $C_f$ component models the sensed capacitance of the pads and insulating layer (see sensing pads 106 and insulating layer 108 in FIG. 1). The effective value of $C_f$ may vary from zero (or near zero) to some maximum value (in this example on the order of 10 fF) depending on whether or not an object (e.g., fingerprint ridge) is contacting the insulating layer. As will be described in later detail below, the sensed capacitance can be found based on a ratio of gate capacitance of M1 ($C_{M1}$) and the sum of $C_f$, $C_p$, and $C_{M1}$.

The M1 transistor is configured as a source follower having its gate tied to the sensing junction J1. The output of M1 is tied to data line Dn when enabling transistor M3 is switched on in response to enable signal Gn. The transistor M1 also acts as a charge pump to charge up capacitors $C_f$ and $C_p$. This charging occurs during the operation cycle of the pixel 100, when M3 is enabled. In one prior art embodiment, the operation cycle is between 50-50 µs. During part of the cycle (charging interval), the potential of data line Dn is brought down to a first voltage level, which causes excess charge built up on gain capacitance $C_{M1}$ by current flowing through diode D1 to maintain a stable charge voltage $V_{charge} = V_{diode}$ bias.

When the data line voltage is returned to its original voltage in a later part of the operating cycle (sensing interval), the charge accumulated on the gate of M1 during charging interval will be redistributed among $C_p$, $C_f$, and $C_{M1}$. The final voltage ($V_{sense}$) at the sensing junction J1 at the end of the sensing interval becomes the input of the source follower M1, and the output of M1 at this interval can be read out on Dn. The difference $\Delta V$ between the $V_{charge}$ and $V_{sense}$ potentials can be expressed as $\Delta V$ is approximately proportional to $C_{M1}/(C_f + C_p + C_{M1})$. Generally, the capacitance $C_f$ may be determined by measuring current flow through Dn during the sensing interval.

While the above-described prior art embodiment of the active pixel 100 provides a good signal-to-noise ratio, three transistors and a diode are required to form the active pixel 100. The result is a scanner that could provide a pixel density of approximately 500 ppi. However, technology requirements are ever-expanding and there is a desire to produce an active pixel with up to double the pixel density, i.e. 1000 ppi. A 1000 ppi pixel density is difficult to achieve using the above-described prior art design without using design rules that would exceed most TFT manufacturer's capabilities. As such, disclosed herein below, is a pixel design for an active pixel wherein only two transistors are required yet a desired 1000 ppi pixel density is substantially achieved and manufacturability is eased.

Figure 4:
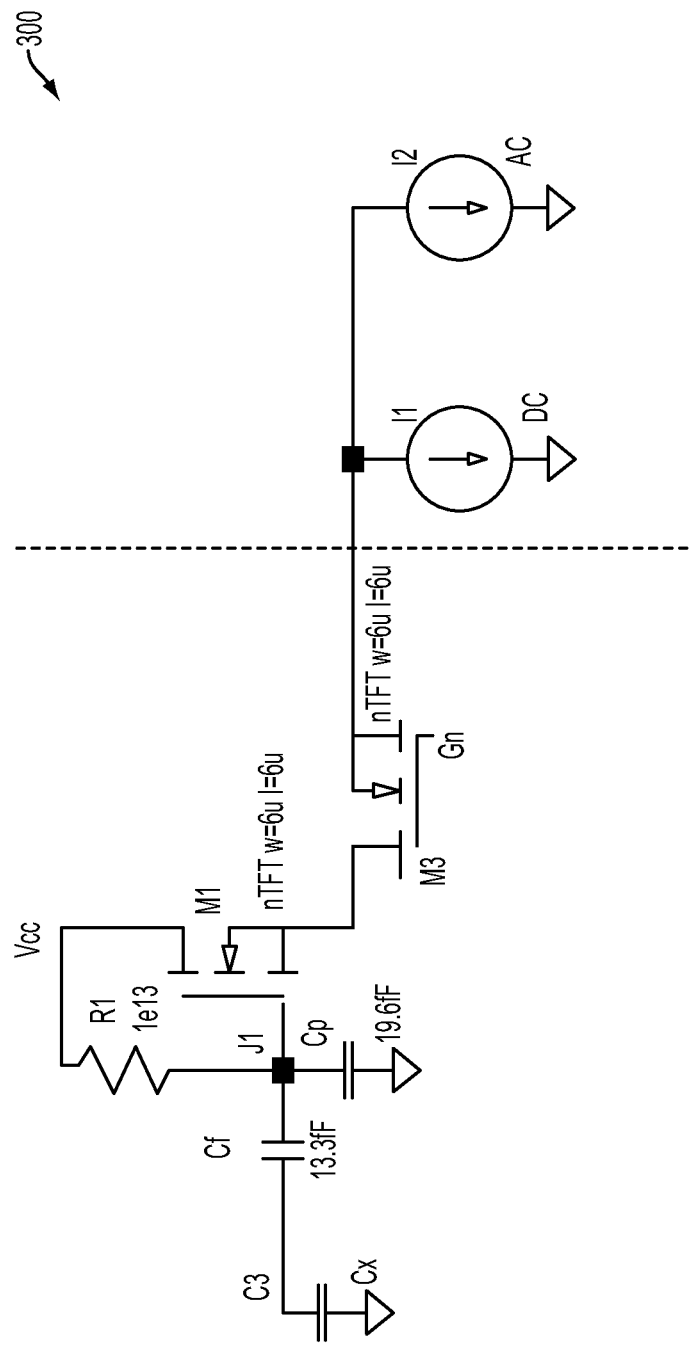
FIG. 4 is a schematic diagram illustrating an active pixel circuit according to an example embodiment.

Referring now to FIG. 4, an active pixel 300 of an example embodiment is disclosed. The design of active pixel 300 has been streamlined from that of FIG. 3 to eliminate the diode D1 and the reset transistor M2. The remaining transistors comprise a source follower transistor M1 and a pixel selection transistor M3. As seen in FIG. 4, a series capacitance comprising $C_3$ and $C_f$ is connected to junction J1 as is capacitor $C_p$. As before, $C_p$ represents the parasitic capacitance of the pixel 300 while $C_f$ models the sensed capacitance of the pads and insulating layer (see sensing pads 106 and insulating layer 108 in FIG. 1). The series capacitance of $C_f$ and $C_3$, which itself has a value of $C_x$, has a combined capacitive value that may vary from zero (or near zero) to some maximum value, e.g., on the order of about 13.3 fF, depending on whether or not an object (e.g., fingerprint ridge) is contacting or near the insulating layer 108. The value of $C_x$ is essentially the object to imager platen, i.e., substrate 104, capacitance.

The M1 transistor of FIG. 4 is configured as a source follower having its gate tied to the sensing junction J1. However, because the topology has removed the reset transistor M2 of the embodiment of FIG. 3, a DC path is needed for the gate of M1. Resistor R1 provides this path. Resistor R1 may comprise a semi-insulative layer covering all of the pixels 300 and is tied to supply voltage $V_{cc}$. In a simulation of the pixel 300 a value of 1e13 Ohms was used for R1, however, R1 may be any value as long as the value is much greater than the impedance of $C_p$ at a probing frequency, described further below, of the readout process.

Figure 5:
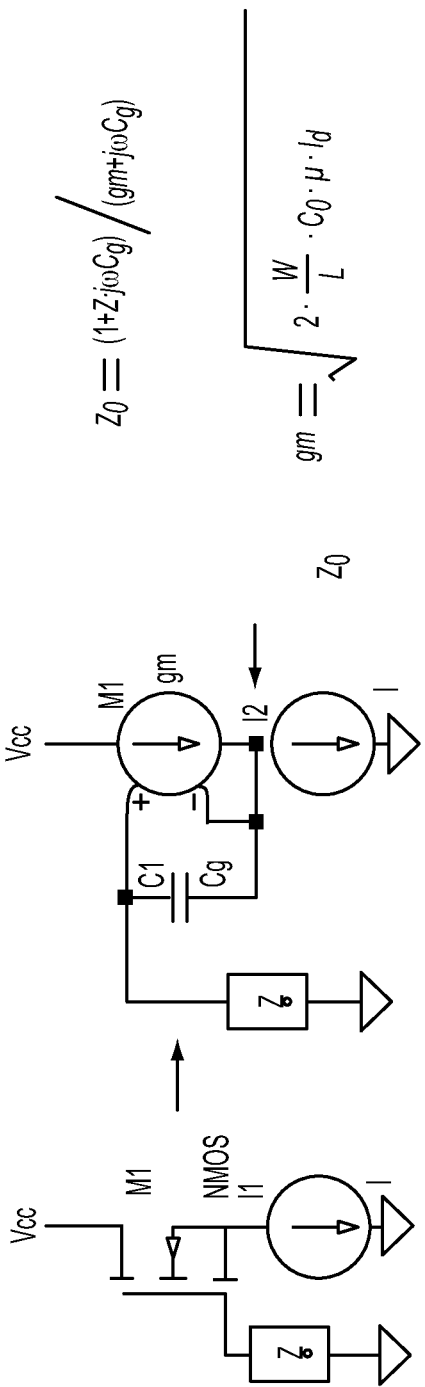
FIG. 5 is a schematic of a source follower circuit, a standard equivalent of the source follower circuit and the derived output impedance of the source follower circuit.

With M1 operating as the source follower transistor and M3 operating as the pixel selection transistor, the circuit of FIG. 4 is additionally provided with two current sources I1 and I2. I1 and I2 are DC and AC current sources, respectively, that either are implemented at the peripheral of substrate 104 using TFT technology or provided by a readout chip. I1 is the DC source operating to ensure that a correct working bias point is set. I2 is the "probing" AC source operating to provide a known amplitude and frequency current to the pixel 300. Specifically, the output impedance of the source follower M1 is interrogated by injecting the AC current I2 and measuring the voltage response which thereby enables a determination of the output impedance of M1 as a function of its input impedance. The input impedance varies in accordance with the distance of an object from the insulating layer 108. A standard source follower circuit, equivalent circuit, and the derived output impedance as a function of input impedance are shown in FIG. 5.

Figure 6:
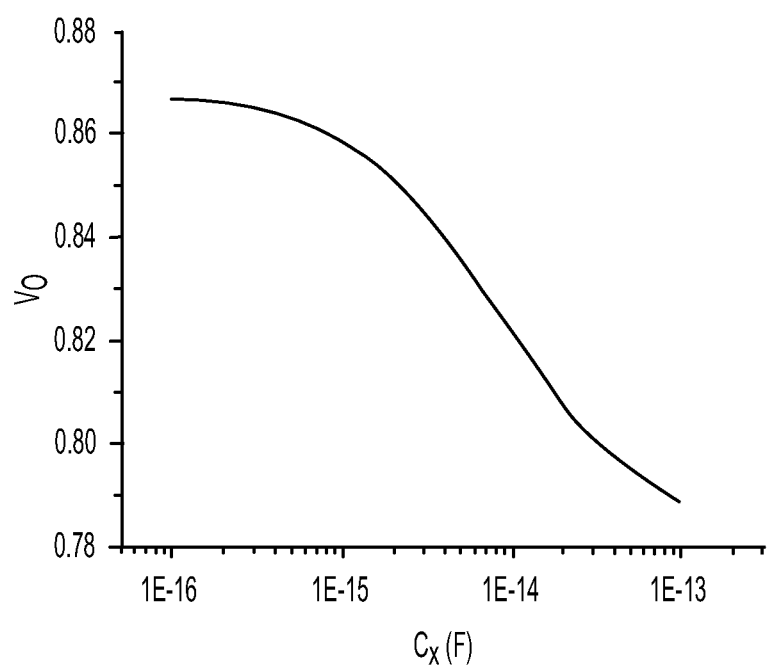
FIG. 6 is a graph illustrating results of a SPICE simulation of a pixel configured as shown in FIG. 4.

The pixel 300 of FIG. 4 was simulated in a SPICE circuit simulator with typical parameters (I1=10 uA, I2=5 uA (AC) and 100 KHz), and $C_x$ ranging from 1e-16 to 1e-13 F). The results are shown in FIG. 6, where $V_o$ is the AC component at the output node, junction J1. Note there is essentially no change of the response $V_o$ when the probe current frequency of I2 is changed from 1 KHz to 100 KHz.

While this simulation was assumed to be a small signal, sinusoidal AC source for simplicity in analysis and simulation, it should be noted that in a non-simulation situation, one may choose to use a digital switching (e.g., large, square wave) implementation to provide a digitally compatible circuit. It should additionally be noted that while the output impedance of the source follower M1 was interrogated by injecting an AC current and measuring the voltage response, the design of the pixel 300 could be modified to measure resulting AC current with an applied AC voltage. And, although specific component types and respective values are shown in FIG. 4, one of ordinary skill in the art will appreciate that component types and variables can change from what is shown while still falling within the scope of the claimed invention. For example, the n-channel transistors depicted may be replaced with p-channel transistors with the remainder of the circuit modified as appropriate to accommodate the p-channel transistors.

According to an example embodiment, a plurality of pixels 300 are substituted for pixels 100 and incorporated into an array 102 of pixels such as that shown in FIG. 2. By scanning each pixel 300 in an active array 102, measurements of the output impedance of M1 can be assembled into an image.

Figure 7:
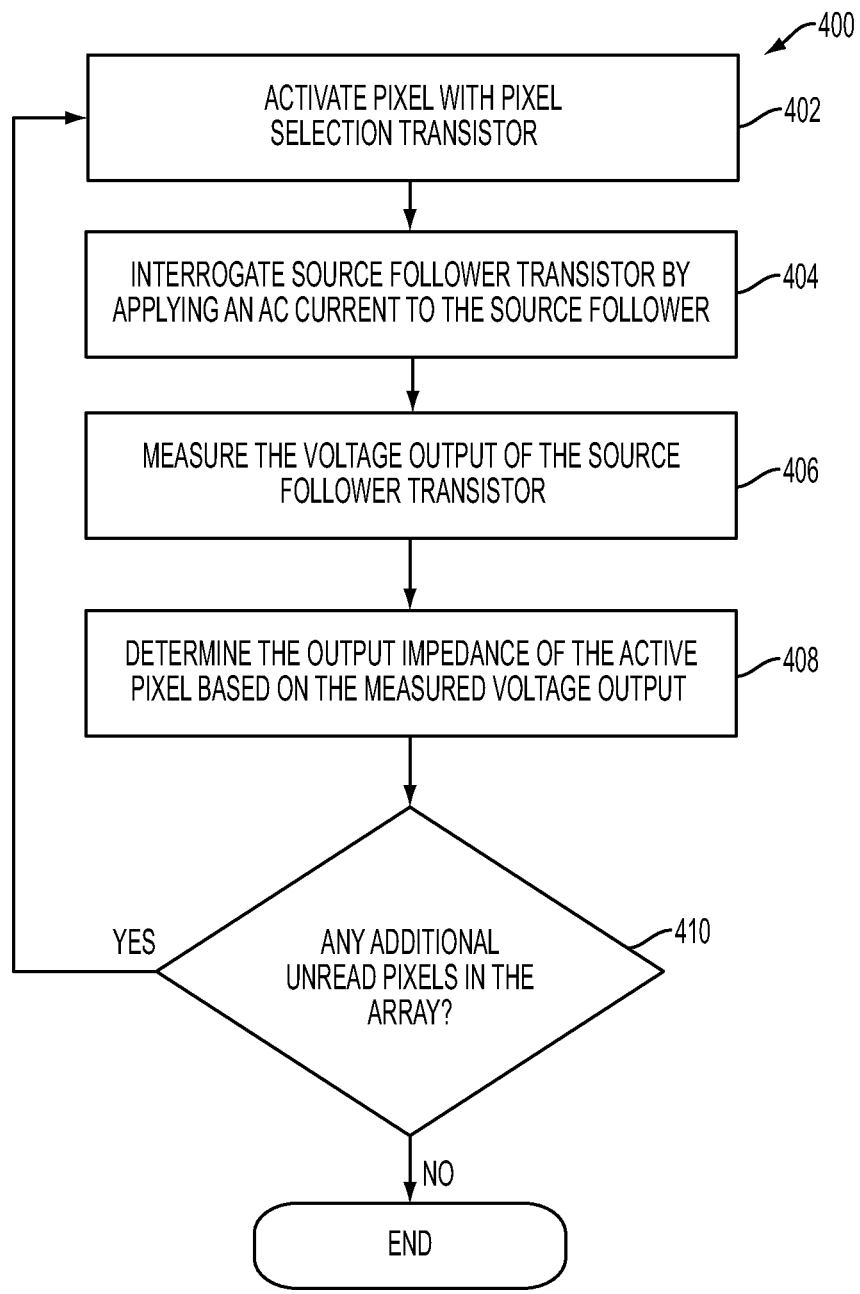
FIG. 7 is a flowchart illustrating a procedure according to an example embodiment.

In reference now to FIG. 7, a flowchart illustrates a method according to an example embodiment. Specifically, the flowchart depicts a procedure 400 for obtaining an impedance readout of an active pixel sensor within an array of pixels in accordance with the pixel 300 described above. Initially, a pixel is activated with a pixel selection transistor, per block 402. The source follower transistor, which is coupled to a variable capacitance, is then interrogated by applying an AC current source to the source follower transistor, per block 404. The voltage output of the source follower transistor is measured, per block 406. The output impedance of the active pixel is determined based on the measured voltage output, per block 408. If there are any additional unread pixels, the above-described process is repeated, per decision block 410, until all pixels have provided a readout from which an image can be formed. If all pixels have provided a readout, the process is terminated.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

The invention claimed is:

1. A capacitive image pixel, comprising:
a two-transistor configuration, comprising:
a source follower transistor having an input impedance and an output impedance that is a function of the input impedance, and
a pixel selection transistor arranged to activate the source follower transistor; and
an insulator layer arranged with respect to the source follower transistor so that an object contacting or near the insulator layer provides a variable capacitance that affects the input impedance of the source follower transistor,
wherein the source follower transistor is configured to be interrogated by an AC current source to determine the output impedance of the source follower, the output impedance of the source follower representative of a nearness of the object.

2. The capacitive image pixel of claim 1, wherein the variable capacitance varies in accordance with the nearness of the object, wherein the object is affective in altering capacitance.

3. The capacitive image pixel of claim 1, further comprising a DC current source.

4. The capacitive image pixel of claim 3, wherein the DC current source sets a working bias point.

5. The capacitive image pixel of claim 1, wherein the AC current source provides a known amplitude and frequency.

6. The capacitive image pixel of claim 1, wherein the capacitive image pixel is implemented with thin film technology.

7. The capacitive image pixel of claim 1, wherein the AC current source provides a sinusoidal signal or a square-wave signal.

8. A capacitive image sensor, comprising:
a sensor array comprising a plurality of active pixels, each active pixel in the sensor array comprising a two-transistor (2T) configuration, comprising:
a source follower transistor having an input impedance and an output impedance that is a function of the input impedance; and
a pixel selection transistor arranged to activate the source follower transistor; and an insulator layer arranged with respect to the source follower transistor so that an object contacting or near the insulator layer provides a variable capacitance that affects the input impedance of the source follower transistor, wherein the source follower transistor is configured to be interrogated by an AC current source to determine the output impedance of the source follower, the output impedance of the source follower representative of a nearness of the object.

9. The capacitive image sensor of claim 8, wherein the source follower transistor is coupled to the variable capacitance affecting an input impedance of the source follower.

10. The capacitive image sensor of claim 9, further comprising a DC current source.

11. The capacitive image sensor of claim 10, wherein the DC current source sets a working bias point.

12. The capacitive image sensor of claim 9, wherein the AC current source provides a known amplitude and frequency.

13. The capacitive image sensor of claim 8, wherein the capacitive image sensor is implemented with thin film technology.

14. The capacitive image sensor of claim 9, wherein the AC current source provides a sinusoidal signal or a square-wave signal.

15. The capacitive image sensor of claim 8, wherein the sensor array provides a resolution of 1000 ppi.

16. A method to obtain an impedance readout from a capacitive image pixel having only two transistors comprising a pixel selection transistor and a source follower transistor, the source follower transistor arranged with respect to an insulator layer so that an object contacting or near the insulator layer provides a variable capacitance that affects an input impedance of the source follower transistor, comprising:

activating the source follower transistor with the pixel selection transistor;

interrogating the source follower transistor by applying an AC current source to the source follower transistor; and determining an output impedance of the source follower transistor based on the interrogation, wherein the output impedance is a function of the input impedance and wherein the output impedance is representative of a nearness of an object that is capable of affecting the variable capacitance.

17. The method of claim 16, further comprising measuring a voltage output of the source follower transistor.

18. The method of claim 17, wherein the measured voltage output correlates to the output impedance.

19. The method of claim 16, wherein the AC current source provides a known amplitude and frequency.

20. The method of claim 19, wherein the AC current source provides a sinusoidal signal or a square-wave signal.

* * * * *